US010903417B2

(12) United States Patent
Hashemi et al.

(10) Patent No.: US 10,903,417 B2
(45) Date of Patent: Jan. 26, 2021

(54) MTJ CONTAINING DEVICE WITH REPLACEMENT TOP ELECTRODE

(71) Applicant: International Business Machines Corporation, Armonk, NY (US)

(72) Inventors: Pouya Hashemi, Purchase, NY (US); Alexander Reznicek, Troy, NY (US); Nathan P. Marchack, New York, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 16/266,249

(22) Filed: Feb. 4, 2019

(65) Prior Publication Data
US 2020/0251652 A1 Aug. 6, 2020

(51) Int. Cl.
H01L 43/12 (2006.01)
H01L 43/02 (2006.01)
H01L 27/22 (2006.01)

(52) U.S. Cl.
CPC ............ H01L 43/12 (2013.01); H01L 27/222 (2013.01); H01L 43/02 (2013.01)

(58) Field of Classification Search
CPC ....... H01L 43/12; H01L 43/02; H01L 27/222; H01L 43/04; H01L 43/14
See application file for complete search history.

(56) References Cited

U.S. PATENT DOCUMENTS 9,299,745 B2 3/2016 Zhang et al.
9,525,128 B2 12/2016 Chung et al.
10,069,064 B1 9/2018 Haq et al.
2012/0211847 A1* 8/2012 Tsukamoto ............. H01L 43/12
257/421
2018/0123031 A1 5/2018 Adelmann et al.
2018/0166623 A1 6/2018 Diaz et al.
2018/0269385 A1 9/2018 Iwata et al.
2018/0309051 A1 10/2018 Deshpande et al.
2019/0259941 A1* 8/2019 Yang ..................... G11C 11/161

FOREIGN PATENT DOCUMENTS

WO 2010051010 A1 5/2010

OTHER PUBLICATIONS

Boullart, W., et al., "STT MRAM patterning challenges", Proceedings of SPIE—The International Society for Optica Engineering, Conference: SPIE Advanced Lithography, Mar. 2013, pp. pp. 86850F-1 to 86850F-9.

* cited by examiner

Primary Examiner — Stephen W Smoot
Assistant Examiner — Vicki B. Booker
(74) Attorney, Agent, or Firm — Scully, Scott, Murphy & Presser, P C.; Daniel P. Morris, Esq.

(57) ABSTRACT

A method of forming a magnetic tunnel junction (MTJ) containing device is provided in which a patterned sacrificial material is present atop a MTJ pillar that is located on a bottom electrode. A passivation material liner and a dielectric material portion laterally surround the MTJ pillar and the patterned sacrificial material. The patterned sacrificial material is removed from above the MTJ pillar and replaced with a top electrode. A seam is present in the top electrode. The method mitigates the possibility of depositing resputtered conductive metal particles on a sidewall of the MTJ pillar. Thus, improved device performance, in terms of a reduction in failure mode, can be obtained.

19 Claims, 4 Drawing Sheets

MTJ CONTAINING DEVICE WITH REPLACEMENT TOP ELECTRODE

BACKGROUND

The present application relates to a magnetic tunnel junction (MTJ) containing device and a method of forming the same. More particularly, the present application relates to a MTJ containing device that includes a bottom electrode, a MTJ pillar, and a top electrode that is formed by replacement metal deposition.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such a configuration is known as a magnetic tunnel junction (MTJ) pillar.

MRAM is a viable memory option for stand alone and embedded applications such as, for example, internet of things (IoT), automobile, or artificial intelligence (AI). The top electrode, which is formed above the MTJ pillar, plays a significant role on the array yield, especially at scaled pitch sizes.

The conductive metallic electrodes used in MTJ containing devices can be resputtered as conductive metal particles that can deposit on a sidewall of the MTJ pillar, especially when an ion beam etching (IBE) process is used to clean the sidewall of the MTJ pillar. If resputtered conductive metal particles deposit on the tunnel barrier material of the MTJ pillar, electrical shorts may arise, which is a common failure mode.

There is thus a need for providing a MTJ containing device in which the above problem is substantially reduced, if not totally eliminated.

SUMMARY

A method of forming a magnetic tunnel junction (MTJ) containing device is provided in which a patterned sacrificial material is present atop a MTJ pillar that is located on a bottom electrode. A passivation material liner and a dielectric material portion laterally surround the MTJ pillar and the patterned sacrificial material. The patterned sacrificial material is removed from above the MTJ pillar and replaced with a top electrode. A seam is present in the top electrode. The term "seam" is used throughout the present application to denote a vertical line of dangling bonds in the center of the top electrode. The method mitigates the possibility of depositing resputtered conductive metal particles on a sidewall of the MTJ pillar. Thus, improved device performance, in terms of a reduction in failure mode, can be obtained.

In one aspect, a magnetic tunnel junction (MTJ) containing device is provided. The MTJ containing device may be a memory device or a sensor. In one embodiment, the MTJ containing device includes a MTJ pillar located on a bottom electrode. A top electrode is located on the MTJ pillar. In accordance with the present application, a seam is present in the top electrode.

In another aspect, a method of forming a magnetic tunnel junction (MTJ) containing device is provided. In one embodiment, the method includes forming a structure comprising a MTJ pillar located on a surface of a bottom electrode, and a patterned sacrificial material located on the MTJ pillar. A passivation material layer is then formed on physically exposed surfaces of the MTJ pillar and the patterned sacrificial material. Next, a dielectric material layer is formed on the passivation material layer and above the patterned sacrificial material. The dielectric material layer and the passivation material layer that are located above the patterned sacrificial material are then removed to physically expose the patterned sacrificial material. Next, the patterned sacrificial material is removed to provide a top electrode cavity, and thereafter a top electrode is formed in the top electrode cavity. In accordance with the present application, a seam is present in the top electrode.

DETAILED DESCRIPTION

Figure 1:
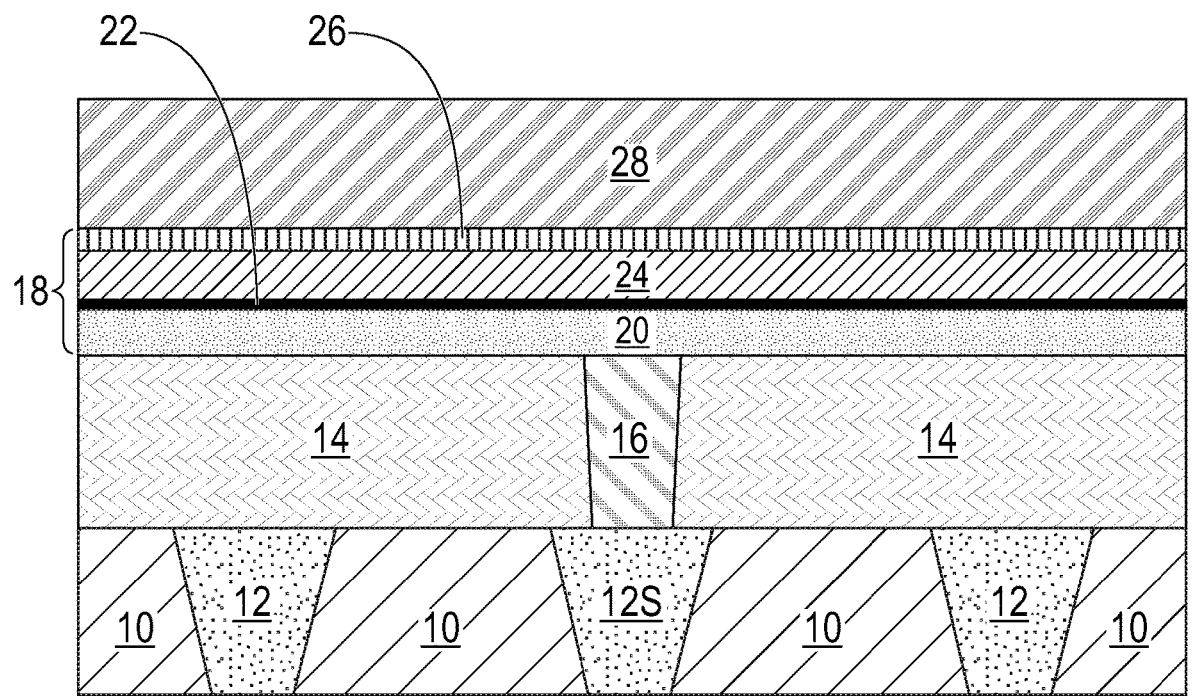
FIG. 1 is a cross sectional view of an exemplary MTJ containing device of the present application and during an early stage of fabrication, the MTJ containing device including an interconnect level containing an electrically conductive structure embedded in an interconnect dielectric material layer, a bottom electrode located on a surface of the electrically conductive structure, a dielectric material located adjacent to the bottom electrode and on the interconnect level, a MTJ stack located on the dielectric material and the bottom electrode, and a sacrificial material layer located on the MTJ stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary MTJ containing device of the present application and during an early stage of fabrication. Exemplary MTJ containing devices include, but are not limited to, memory devices (e.g., MRAM or spin-transfer torque (STT) MRAM), or sensors such as, for example, pressure sensors. Notably, the exemplary MTJ containing device shown in FIG. 1 includes an interconnect level containing an electrically conductive structure 12S embedded in an interconnect dielectric material layer 10, a bottom electrode 16 located on a surface of the electrically conductive structure 12S, a dielectric material located adjacent to, and embedding, the bottom electrode 16, a MTJ stack 18 located on the dielectric material and the bottom electrode 16, and a sacrificial material layer 28 located on the MTJ stack 18.

It is noted that the drawings of the present application illustrate a device area in which a MTJ containing device will be formed. A non-MTJ containing device area may be located adjacent to the MTJ containing device area illustrated in the drawings of the present application. It is also noted that while a single bottom electrode 16 is described and illustrated, the present application can be used when a plurality of bottom electrodes 16 are formed. In such an embodiment, each bottom electrode 16 would be located on a surface of one of the electrically conductive structures 12S. In some embodiments, and as shown, electrically conductive structures 12 (not used as a component of the MTJ containing device) are present in the interconnect dielectric material layer 10; however, no bottom electrode 16 is formed thereon.

It is noted that at least one other interconnect level and/or a middle-of-the-line (MOL) level may be located beneath the interconnect level including the interconnect dielectric material layer 10 and the electrically conductive structures 12, 12S. These other levels are not shown for clarity.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structures 12, 12S are composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner is formed along the sidewalls and a bottom wall of the electrically conductive structures 12, 12S. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structures 12, 12S, and, if present, the diffusion barrier liners may be formed utilizing conventional processes that are well-known to those skilled in the art including, for example, a damascene process. So as not to obscure the method of the present application, the techniques used to form the interconnect level including the interconnect dielectric material layer 10, the electrically conductive structures 12, 12S, and, if present, the diffusion barrier liners are not provided herein.

In some embodiments (not shown) the bottom electrode 16 is located on a recessed surface of the electrically conductive structure 12S. In such an embodiment, and prior to forming the bottom electrode 16, an upper portion of the electrically conductive structure 12S is removed utilizing a recess etching process, and thereafter the bottom electrode 16 is formed upon the recessed surface of the electrically conductive structure 12S. In such an embodiment, the bottom electrode 16 would be located on an entirety of the recessed topmost surface of the electrically conductive structure 12S. Also, and in such an embodiment, the bottom electrode 16 would have a topmost surface that is coplanar with a topmost surface of the interconnect dielectric material layer 10, and an upper portion of the interconnect dielectric material layer 10 would be laterally adjacent to each sidewall of the bottom electrode 16. Further, and in such an embodiment, dielectric capping layer 14 shown in FIG. 1 can be omitted from the structure.

In other embodiments and as illustrated in FIG. 1, the bottom electrode 16 is formed on a non-recessed surface of the electrically conductive structure 12S. In such an embodiment, a dielectric capping layer 14 is located laterally adjacent to the bottom electrode 16 and on a surface of the interconnect dielectric material layer 10. In this embodiment, a smaller width bottom electrode 16 can be provided that does not cover the entirety of the topmost surface of the electrically conductive structure 12S.

When present, the dielectric capping layer 14 may be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 14 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). In some embodiments, and as explained above, the dielectric capping layer 14 may be omitted from the exemplary MTJ containing device. In such an embodiment, an upper portion of the interconnect dielectric material layer 10 would be the dielectric material that is located laterally adjacent to the bottom electrode 16. In some embodiments and as is illustrated in FIG. 1, the bottom electrode 16 has a topmost surface that is coplanar with a topmost surface of a dielectric capping layer 14 that may be present laterally adjacent to the bottom electrode 16 and on a topmost surface of the interconnect dielectric material layer 10.

The dielectric capping layer 14 may be formed prior to, or after, forming the bottom electrode 16. In embodiments when the dielectric capping layer 14 is formed prior to the bottom electrode 16, a blanket layer of dielectric capping material is formed and thereafter an opening is formed (by photolithography and etching) in the dielectric capping material. The bottom electrode 16, as defined below, is then formed in the opening. In such an embodiment, the bottom electrode 16 is formed by deposition, followed by a planarization process. In embodiments in which the bottom electrode 16 is formed prior to the dielectric capping layer 14, the bottom electrode 16 is formed by deposition and patterning, and thereafter the dielectric capping material is deposited and a subsequent planarization process may be performed.

Bottom electrode 16, which is present on a surface of the electrically conductive structure 12S, may be composed of a conductive material such as, for example, Ta, TaN, Ti, TiN, Ru, RuN, RuTa, RuTaN, Co, CoWP, CoN, W, WN or any combination thereof. The bottom electrode 16 may have a thickness from 2 nm to 25 nm; other thicknesses are possible and can be used in the present application as the thickness of the bottom electrode 16. The bottom electrode 16 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 16.

In some embodiments, the MTJ stack 18 includes at least a magnetic reference layer 20, a tunnel barrier layer 22, and a magnetic free layer 24, as configured in FIG. 1. In some embodiments and as shown in FIG. 1, the MTJ stack may also include a MTJ cap layer 26. In other embodiments, the MTJ stack 18 is reversed such that the magnetic free layer 24 represents a bottommost component of the MTJ stack 18. In such an embodiment, a metallic seed layer is formed prior to forming the magnetic free layer 24, and the MTC cap layer would be formed upon a physically exposed surface of the magnetic reference layer 20.

Although not shown, the MTJ stack 18 may also include a non-magnetic spacer layer located on the magnetic free layer, a second magnetic free layer located on the non-magnetic spacer layer, and another MTJ cap layer may be located on the second magnetic free layer. The various material layers of the MTJ stack 18 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 20 has a fixed magnetization. The magnetic reference layer 20 may be composed of a metal or metal alloy (or a stack thereof) that includes one or more metals exhibiting high spin polarization. In alternative embodiments, exemplary metals for the formation of the magnetic reference layer 20 include iron, nickel, cobalt, chromium, boron, or manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron, cobalt-iron-boron, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators.

The magnetic free layer 24 may be composed of a magnetic material (or a stack of magnetic materials) with a magnetization that can be changed in orientation relative to the magnetization orientation of the magnetic reference layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the MTJ cap layer 26 can be composed of W, WN, Ta, TaN, Ti, TiN, Ru, Mo, Cr, V, Pd, Pt, Rh, Sc, Al or other high melting point metals or conductive metal nitrides. The MTJ cap layer 26 may have a thickness from 2 nm to 25 nm; other thicknesses are possible and can be used in the present application as the thickness of the MTJ cap layer 26.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

The sacrificial material layer 28 may include any semiconductor material or dielectric material that does not include a metallic element (such as, for example, Ta or Ti) and that can be selectively removed from the MTJ containing device during a subsequently performed etching process. Exemplary materials for the sacrificial material layer 28 include but are not limited to, silicon oxide, silicon nitride, silicon oxynitride, amorphous germanium, amorphous silicon, amorphous silicon-germanium or amorphous carbon. The sacrificial material layer 28 can be formed by a deposition process such as, for example, plasma enhanced chemical vapor deposition or plasma enhanced atomic layer deposition (PEALD). The sacrificial material layer 28 can have a thickness from 5 nm to 50 nm; although other thicknesses for the sacrificial material layer 28 can be used in the present application.

Figure 2:
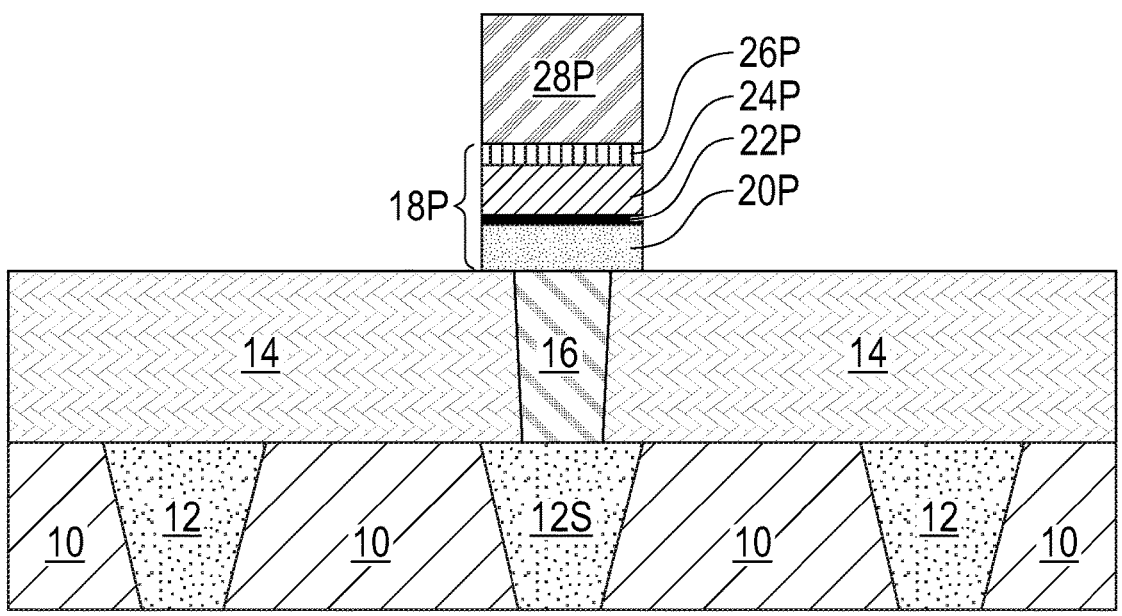
FIG. 2 is a cross sectional view of the exemplary MTJ containing device of FIG. 1 after patterning the sacrificial material layer and the MTJ stack to provide a patterned sacrificial material, and a MTJ pillar, respectively.

Referring now to FIG. 2, there is illustrated the exemplary MTJ containing device of FIG. 1 after patterning the sacrificial material layer 28 and the MTJ stack 18 to provide a patterned sacrificial material 28P, and a MTJ pillar 18P, respectively. The patterning may be achieved by photolithography and etching. Photolithography includes forming a blanket layer of a photoresist material on a material or material stack that needs to be patterned, exposing the blanket layer of photoresist material to a desired pattern of radiation, and developing the exposed photoresist material utilizing a conventional resist developer to provide a patterned photoresist containing at least one pattern formed therein. The photoresist material may be a positive-tone photoresist, a negative-tone photoresist or a hybrid-tone photoresist. The etching process (i.e., pattern transfer etch) includes one or more etching steps. The one or more etching steps typically include one or more reactive ion etching steps. Following pattern transfer, the patterned resist is removed utilizing a conventional resist stripping process such as, for example ashing.

As is shown, the MTJ pillar 18P has a sidewall that is vertically aligned to the sidewall of the patterned sacrificial material 28P. The MTJ pillar 18P and the patterned sacrificial material 28P have a critical dimension (i.e., a diameter of the feature) that is about equal or greater than a critical dimension of the underlying bottom electrode 16. In one example, the critical dimension of the MTJ pillar 18P and the patterned sacrificial material 28P can be from 15 nm to 100 nm, while the critical dimension of the bottom electrode 16 can be from 10 nm to 90 nm.

The MTJ pillar 18P includes at least a remaining portion of the magnetic reference layer 20 (hereinafter magnetic reference material 20P), a remaining portion of the tunnel barrier layer 22 (hereinafter tunnel barrier material 22P), and a remaining portion of the magnetic free layer 24 (hereinafter magnetic free material 24P). In some embodiments, the MTJ pillar 18P may also include a remaining portion of the non-magnetic spacer, a remaining portion of the second magnetic reference layer, and/or a remaining portion of the MTJ cap layer 26P.

Figure 3:
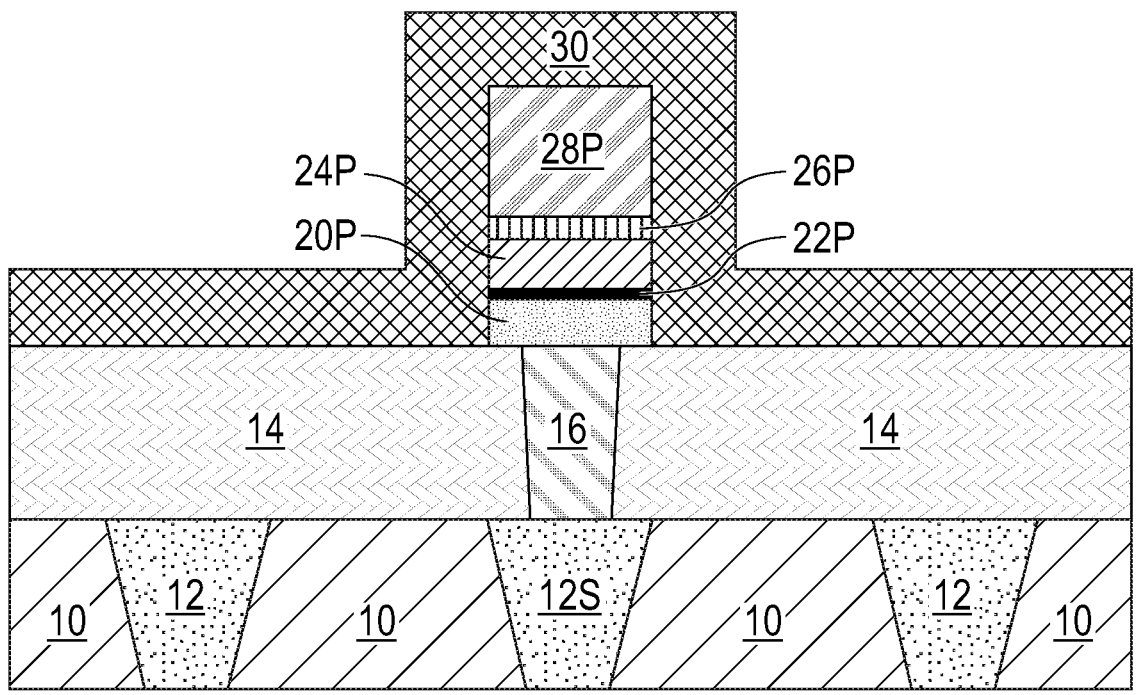
FIG. 3 is a cross sectional view of the exemplary MTJ containing device of FIG. 2 after forming a passivation material layer on physically exposed surfaces of the MTJ pillar and the patterned sacrificial material.

Referring now to FIG. 3, there is illustrated the exemplary MTJ containing device of FIG. 2 after forming a passivation material layer 30 on physically exposed surfaces of the MTJ pillar 18P and the patterned sacrificial material 28P. The passivation material layer 30 also extends onto the physically exposed surface of either the dielectric capping layer 14 (if present) or the interconnect dielectric material layer 10.

The passivation material layer 30 is composed of a dielectric material. In one example, the passivation material layer 30 is composed of silicon nitride. In another example, the passivation material layer 30 may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation material layer 30 may be composed of an nBLOK dielectric material that contains atoms of silicon, carbon, hydrogen, nitrogen and oxygen. In alternative example, the passivation material layer 30 may be composed of a SiBCN dielectric material that contains atoms of silicon, boron, carbon, hydrogen, and nitrogen.

The passivation material layer 30 can be formed utilizing a deposition process such as, for example, PECVD, PVD, or PEALD. The passivation material layer 30 may have a thickness from 5 nm to 100 nm. Other thicknesses are possible and can be employed as the thickness of the passivation material layer 30. In some embodiments, the passivation material layer 30 has a conformal thickness. The term "conformal" denotes that a material layer has a vertical thickness along horizontal surfaces that is substantially the same (i.e., within ±5%) as the lateral thickness along vertical surfaces.

Figure 4:
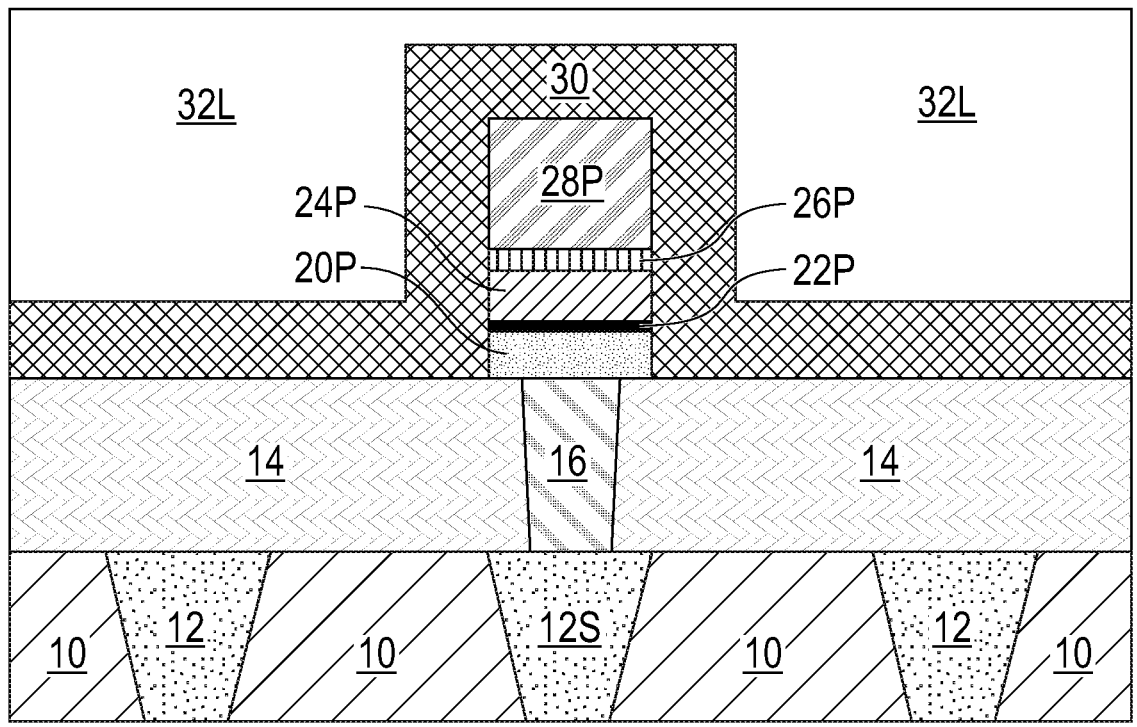
FIG. 4 is a cross sectional view of the exemplary MTJ containing device of FIG. 3 after forming a dielectric material layer.

Referring now to FIG. 4, there is illustrated the exemplary MTJ containing device of FIG. 3 after forming a dielectric material layer 32L. The dielectric material layer 32L is composed of a dielectric material that is compositionally different from the passivation material layer 30. Exemplary dielectric materials for dielectric material layer 32L include, for example, silicon dioxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. The dielectric material layer 32L can be formed by a deposition process such as, for example, PECVD, PVD, PEALD or spin-on coating.

Figure 5:
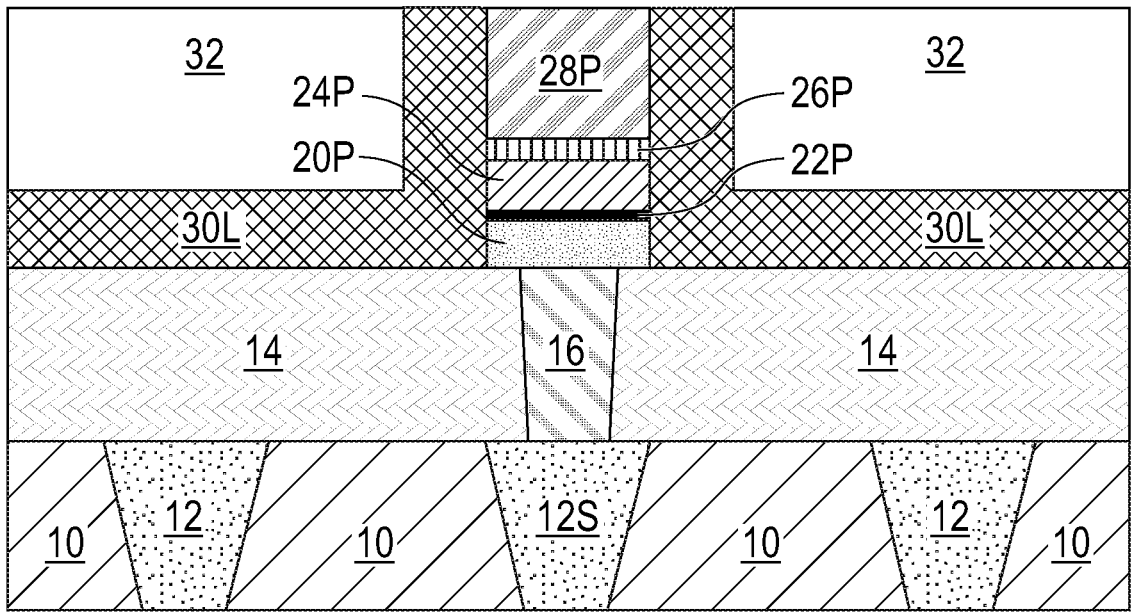
FIG. 5 is a cross sectional view of the exemplary MTJ containing device of FIG. 4 after removing the dielectric material layer and the passivation material layer that are located above the patterned sacrificial material.

Referring now to FIG. 5, there is illustrated the exemplary MTJ containing device of FIG. 4 after removing the dielectric material layer 32L and the passivation material layer 30 that are located above the patterned sacrificial material 28P. The removal of the dielectric material layer 32L and the passivation material layer 30 that are located above the patterned sacrificial material 28P is performed utilizing a planarization process such as, for example, chemical mechanical polishing (CMP). The removal of the dielectric material layer 32L and the passivation material layer 30 that are located above the patterned sacrificial material 28P physically exposes a topmost surface of the patterned sacrificial material 28P.

A portion of the dielectric material layer 32L and a portion of the passivation material layer 30 remain after this removal step. The remaining portion of the dielectric material layer 32L may be referred to herein as a dielectric material portion 32, and the remaining portion of the passivation material layer 30 may be referred to herein as a passivation material liner 30L. The dielectric material portion 32 and the passivation material liner 30L laterally surround the stack including the patterned sacrificial material 28P and the MTJ pillar 18P. As is shown, and at this point of the present application, the dielectric material portion 32 has a topmost surface that is coplanar with a topmost surface of both the passivation material liner 30L and the patterned sacrificial material 28P.

Figure 6:
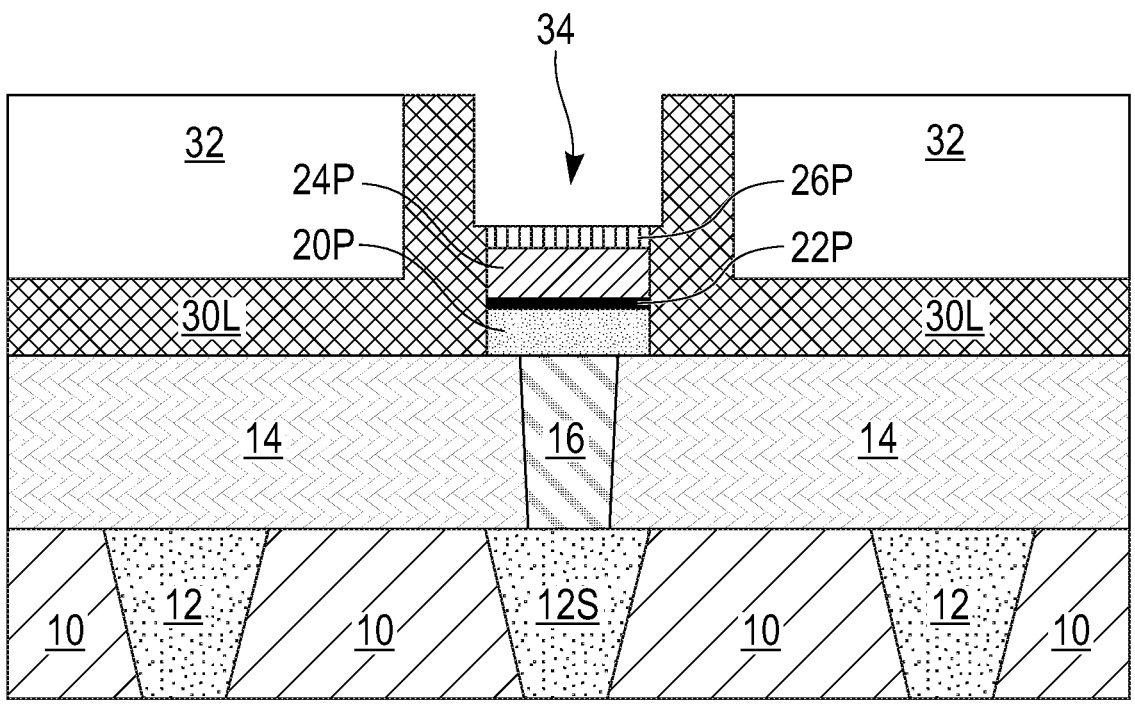
FIG. 6 is a cross sectional view of the exemplary MTJ containing device of FIG. 5 after removing the patterned sacrificial material to provide a top electrode cavity.

Referring now to FIG. 6, there is illustrated the exemplary MTJ containing device of FIG. 5 after removing the patterned sacrificial material 28P to provide a top electrode cavity 34; a topmost surface of the MTJ pillar 18P is now physically exposed. The top electrode cavity 34 is located above the MTJ pillar 18P and is located between an upper portion of the passivation material liner 30L that laterally surrounds the patterned sacrificial material 28P. A side wall portion of the passivation material liner 30L as well as its top portions are also removed during this etch to provide a top electrode cavity that has a wider dimension than the critically dimension of the sacrificial material 28P. In some embodiments, the top electrode cavity 34 has a dimension from 20 nm to 110 nm.

The removal of the patterned sacrificial material 28P comprises an etching process that is selective in removing the sacrificial material. In one example, the etching process that can be used to remove the patterned sacrificial material 28P includes a wet process or a reactive ion etch process.

Figure 7:
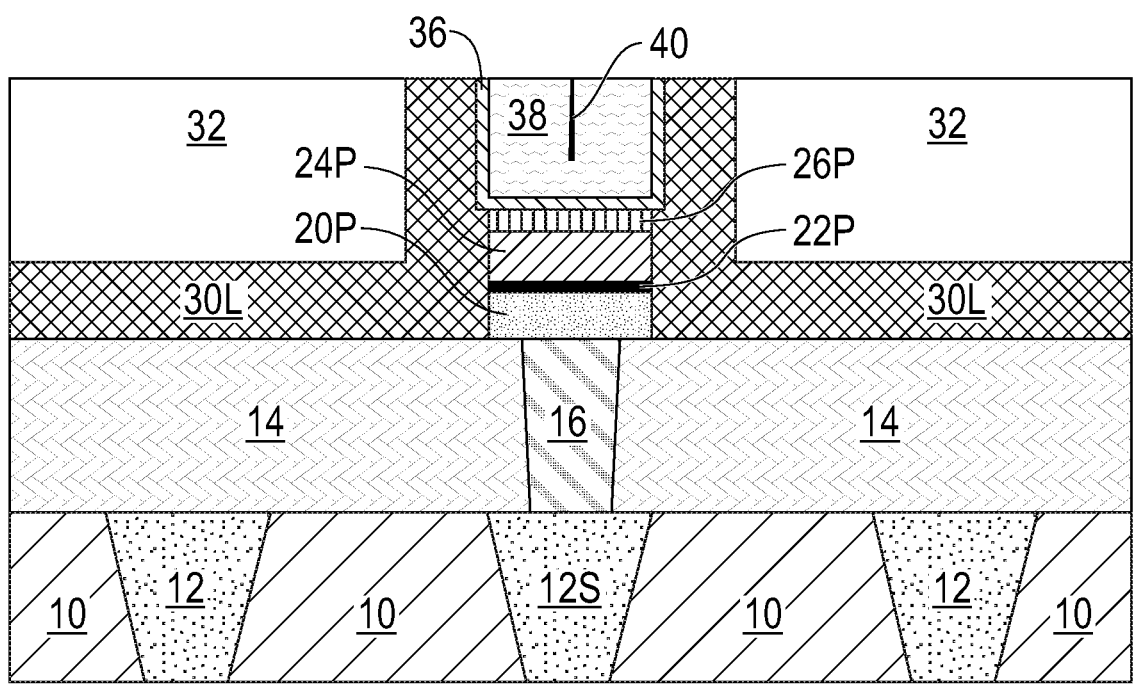
FIG. 7 is a cross sectional view of the exemplary MTJ containing device of FIG. 6 after forming a top electrode in the top electrode cavity, wherein a seam is present in the top electrode.

Referring now to FIG. 7, there is illustrated the exemplary MTJ containing device of FIG. 6 after forming a top electrode 38 in the top electrode cavity 34. A seam 40 is present in the top electrode 38. In some embodiments, a diffusion barrier liner 36 is also present in the top electrode cavity 34 and the diffusion barrier liner 36 is located on a sidewall and bottom wall of the top electrode 38.

If present, the diffusion barrier liner 36, which is U-shaped, includes one of the diffusion barrier materials mentioned above for the optional diffusion barrier liner. The top electrode 40 includes one of the conductive materials mentioned above for the bottom electrode 16. In one embodiment, the top electrode 38 is composed of a compositionally same conductive material as the bottom electrode 16. In another embodiment, the top electrode 38 is composed of a compositionally different conductive material than the bottom electrode 16.

If present, a layer of a diffusion barrier material is first formed on a topmost surface of both the dielectric material portion 32 and the passivation material liner 30L, and along a sidewall and bottom wall of the top electrode cavity 34. The layer of diffusion barrier material does not fill in the entirety of the top electrode cavity 34. The layer of a diffusion barrier material can be formed utilizing a deposition process such as, for example, PECVD or PVD. Next, a conductive material layer is formed on the layer of diffusion barrier material utilizing a deposition process such as, for example, CVD or PECVD. Due to the small dimension of the top electrode cavity 34, the deposition process of the conductive material that provides the top electrode 38 will pinch-off leaving seam 40. Following the deposition of the diffusion barrier material (if present) and the conductive material, a planarization process such, as for, chemical mechanical polishing is performed to provide the MTJ containing device shown in FIG. 7. The planarization process stops on the topmost surface of the passivation material liner 30L. Thus an upper portion of the dielectric material portion 32 is removed during the planarization process.

In one embodiment, the top electrode 38 has a critical dimension that is greater than the critical dimension of the MTJ pillar 18P. In one example of this embodiment of the present application, the critical dimension of the top electrode 38 can be from 20 nm to 110 nm. In another embodiment and depending on the thickness of the diffusion barrier liner 26, the top electrode 38 may have a critical dimension that is equal to, or smaller than, the critical dimension of the MTJ pillar 18P.

FIG. 7 illustrates an MTJ containing device in accordance with the present application and including a MTJ pillar 18P located on a bottom electrode 16. A top electrode 38 (i.e., a replacement top electrode) is located on the MTJ pillar 18P. In accordance with the present application, a seam 40 is present in the top electrode 38. As is shown, a passivation material liner 30L and a dielectric material portion 32 laterally surround the MTJ pillar 18P and the top electrode 38. As is further shown, the top electrode 38 has a topmost surface that is coplanar with a topmost surface of the diffusion barrier liner 36, as well as with the topmost surfaces of the dielectric material portion 32 and the passivation material liner 30L.

It is noted that due to the geometry of the MTJ containing device and the processing steps used in forming the same, no resputtered conductive metal particles are present on a sidewall of the MTJ pillar. As such, electrical shorting is reduced in the MTJ containing device of the present application.

Although not shown, another electrically conductive structure is formed contacting a surface of the top electrode 38. This other electrically conductive structure is embedded in another interconnect dielectric material that is formed on the physically exposed surfaces of the MTJ containing device shown in FIG. 7.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction (MTJ) containing device comprising:
    a MTJ pillar located on a bottom electrode; and
    a top electrode located on the MTJ pillar, wherein a seam is present in the top electrode.

2. The MTJ containing device of claim 1, wherein the top electrode has a critical dimension that is greater than a critical dimension of the MTJ pillar.

3. The MTJ containing device of claim 1, further comprising a diffusion barrier liner located on a sidewall and a bottom wall of the top electrode.

4. The MTJ containing device of claim 1, further comprising a passivation material liner laterally surrounding the MTJ pillar and the top electrode, wherein the passivation material liner has a topmost surface that is coplanar with a topmost surface of the top electrode.

5. The MTJ containing device of claim 4, further comprising a dielectric material portion located on the passivation material liner, wherein the dielectric material portion has a topmost surface that is coplanar with the topmost surface of the passivation material liner and the topmost surface of the top electrode.

6. The MTJ containing device of claim 1, wherein the MTJ pillar has a critical dimension that is greater than a critical dimension of the bottom electrode.

7. The MTJ containing device of claim 1, further comprising a dielectric material adjacent to, and embedding, the bottom electrode.

8. The MTJ containing device of claim 1, wherein the bottom electrode is located on a surface of an electrically conductive structure that is embedded in an interconnect dielectric material layer.

9. The MTJ containing device of claim 1, wherein the MTJ pillar comprises a magnetic reference material, a tunnel barrier material, and a magnetic free material.

10. The MTJ containing device of claim 1, wherein no resputtered conductive metal particles are present on a sidewall of the MTJ pillar.

11. A method of forming a magnetic tunnel junction (MTJ) containing device, the method comprising:
    forming a structure comprising a MTJ pillar located on a surface of a bottom electrode, and a patterned sacrificial material located on the MTJ pillar;
    forming a passivation material layer on physically exposed surfaces of the MTJ pillar and the patterned sacrificial material; forming a dielectric material layer on the passivation material layer and above the patterned sacrificial material;

removing the dielectric material layer and the passivation material layer that are located above the patterned sacrificial material to physically expose the patterned sacrificial material;

removing the patterned sacrificial material to provide a top electrode cavity;

forming a top electrode in the top electrode cavity; and wherein a seam is formed in the top electrode.

12. The method of claim 11, wherein during the removing of the patterned sacrificial material a portion of the remaining passivation material layer is removed.

13. The method of claim 12, wherein the top electrode has a critical dimension that is greater than a critical dimension of the MTJ pillar.

14. The method of claim 11, wherein the forming of the structure comprises:

forming a MTJ stack and a sacrificial material layer; and lithographically patterning the MTJ stack and a sacrificial material layer.

15. The method of claim 11, wherein the MTJ pillar has a critical dimension that is greater than a critical dimension of the bottom electrode.

16. The method of claim 11, wherein the bottom electrode is located on a surface of an electrically conductive structure that is embedded in an interconnect dielectric material layer.

17. The method of claim 11, wherein the removing of the dielectric material layer and the passivation material layer that are located above the patterned sacrificial material comprises a planarization process, and wherein a portion of the dielectric material layer and a portion of the passivation material layer remain laterally adjacent to the MTJ pillar and the patterned sacrificial material.

18. The method of claim 11, wherein the MTJ pillar comprises a magnetic reference material, a tunnel barrier material, and a magnetic free material.

19. The method of claim 11, wherein the forming of the top electrode includes forming a diffusion barrier liner on a sidewall and a bottom wall of the top electrode.

* * * * *